(12) United States Patent
Marsollek et al.

(10) Patent No.: US 11,169,359 B2
(45) Date of Patent: Nov. 9, 2021

(54) METHOD FOR POSITIONING A COMPONENT OF AN OPTICAL SYSTEM

(71) Applicant: Carl Zeiss SMT GmbH, Oberkochen (DE)

(72) Inventors: Pascal Marsollek, Berlin (DE); Stefan Hembacher, Bobingen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 265 days.

(21) Appl. No.: 16/447,553

(22) Filed: Jun. 20, 2019

(65) Prior Publication Data

US 2019/0302402 A1    Oct. 3, 2019

Related U.S. Application Data

(63) Continuation of application No. PCT/EP2017/083341, filed on Dec. 18, 2017.

(30) Foreign Application Priority Data

Dec. 22, 2016   (DE) ................... 102016226079.0

(51) Int. Cl.
   *G02B 26/08*   (2006.01)
   *G02B 7/182*   (2021.01)
   *G03F 7/20*    (2006.01)

(52) U.S. Cl.
   CPC ....... *G02B 7/1828* (2013.01); *G03F 7/70825* (2013.01); *G03F 7/70941* (2013.01)

(58) Field of Classification Search
   CPC ............... G02B 7/1828; G03F 7/70825; G03F 7/70941
   USPC ........................................ 359/200.7
   See application file for complete search history.

(56) References Cited

U.S. PATENT DOCUMENTS

2013/0242282  A1*  9/2013  Hembacher ........... G03F 7/7015
                                                    355/77

FOREIGN PATENT DOCUMENTS

| DE | 10 2012 202 169 A1 | 3/2013 |
| DE | 10 2012 202 170 A1 | 6/2013 |
| DE | 10 2012 202 167 A1 | 8/2013 |
| WO | WO 2015/158487 A1  | 10/2015 |

OTHER PUBLICATIONS

German Office Action, with translation thereof, for corresponding Appl No. 10 2016 226 079.0, dated Aug. 29, 2017.
International Search Report for corresponding PCT Appl No. PCT/EP2017/083341, dated Mar. 20, 2018.

* cited by examiner

*Primary Examiner* — Euncha P Cherry
(74) *Attorney, Agent, or Firm* — Fish & Richardson P.C.

(57) ABSTRACT

For the purposes of positioning a component part, provision is made in an optical system for a stray magnetic field to be detected via a sensor device and for a correction signal for compensating the effect of the stray magnetic field on the positioning of the component part to be ascertained.

20 Claims, 8 Drawing Sheets

METHOD FOR POSITIONING A COMPONENT OF AN OPTICAL SYSTEM

CROSS-REFERENCE TO RELATED APPLICATIONS

The present application is a continuation of, and claims benefit under 35 USC 120 to, international application PCT/EP2017/083341, filed Dec. 18, 2017, which claims benefit under 35 USC 119 of German Application No. 10 2016 226 079.0, filed Dec. 22, 2016. The entire disclosure of these applications are incorporated by reference herein.

FIELD

The disclosure relates to a method for positioning a component part of an optical system. Moreover, the disclosure relates to an optical system.

BACKGROUND

It is desirable to precisely position optical component parts in many applications. Apparatuses for positioning an optical component part, in particular a mirror of a projection exposure apparatus, are known from DE 10 2012 202 169 A1 and DE 10 2012 202 170 A1, for example.

SUMMARY

The present disclosure seeks to improve a method for positioning a component part of an optical system.

In one aspect, the disclosure provides a method for positioning a component part of an optical system. The method includes providing an optical system that includes: a plurality of component parts, of which at least one component part is displaceable via a displacement device; and a sensor device for detecting a stray magnetic field. The method also includes detecting a stray magnetic field via the sensor device. The method further includes determining at least one correction signal for an actuating member of the displacement device of the component part for compensating an optical aberration caused by the effect of the stray magnetic field on the positioning of at least one of the component parts, depending on the stray magnetic field detected via the sensor device. A force feedforward control model or a position feedforward control model serves to determine the correction signal for the actuating member. In addition, the method includes applying the correction signal to the actuating member.

The core of the disclosure includes compensating the effect of a stray magnetic field on the positioning of one or more of the component parts of an optical system. Here, provision is made, in particular, for the stray magnetic field to be detected via a sensor device. A correction signal for an actuating member of a displacement device of one of the component parts of the optical system is determined from the information items about the stray magnetic field in the region of one or more of the component parts of the optical system detected via the sensor device. An optical aberration caused by the effect of the stray magnetic field on the positioning of one or more of the component parts can be compensated at least in part, in particular in full, with the aid of the correction signal. A substantially more precise compensation of the effects of the stray magnetic field on the positioning of one or more of the component parts of the optical system is made possible by detecting the actual stray magnetic field. In particular, the use of a sensor device for ascertaining the stray magnetic field renders it possible to ascertain an actually present stray magnetic field, in particular the magnitude and/or direction thereof, without model assumptions having to be made in the process.

The stray magnetic field can be produced, in particular, by an electromagnetic device, in particular a controllable electromagnetic device for displacing one of the component parts of the optical system.

According to one aspect of the disclosure, a force feedforward control model or a position feedforward control model serves to determine the correction signal. In the process, the stray magnetic field is ascertained via the sensor device, as already mentioned. The conversion of a stray field into the force or position is generated by way of measurements or with the aid of a simulation.

According to a further aspect of the disclosure, the sensor device and the displacement device are arranged in the region of different component parts of the optical system. In particular, it is possible to arrange the sensor device at a first optical component part while the displacement device to be influenced is coupled to another component part. In particular, the displacement device can serve to displace a further optical component part and/or to displace a stage. In particular, it is possible to detect the stray magnetic field via the sensor device in the region of a first component part but apply the correction signal to an actuating member of another component part. Although a complete compensation of an optical aberration caused by the effect of the stray magnetic field on the positioning of the first component part is generally possible only in part, in particular not in full, this may facilitate at least partial compensation of optical aberrations that are caused by the effect of the stray magnetic field on components of the optical system that the displaceable in non-controlled fashion.

In particular, the displacement device can serve to displace an active optical component part, in particular a position-controlled actuated optical component part, in particular a position-controlled actuated mirror.

As an alternative or in addition thereto, the displacement device can serve to displace a passive optical component part, in particular a non-position-controlled actuated component part.

According to a further aspect of the disclosure, the sensor device and the displacement device are arranged in the region of the same component part of the optical system. This facilitates a particularly simple compensation of the effects of the stray magnetic field.

Moreover, a complete compensation of the effects of the stray magnetic field is possible, in principle, in this case. In particular, provision can be made for the effects of the stray magnetic field on the corresponding component part to be compensated by at least 50%, in particular at least 70%, in particular at least 90%.

According to a further aspect of the disclosure, the stray magnetic field is detected in a plurality of directions and/or at a plurality of positions via the sensor device. In particular, the sensor device may include a plurality of sensor elements to this end.

Here and below, detecting the magnetic field is understood to mean the actual measurement of same via the sensor device, in particular via at least one of the sensor elements of same. By contrast, ascertaining the stray magnetic field may also include further processing steps for the measurement results in addition to the measurement of same.

A larger number of the sensor elements leads to an improvement in the measurement information, in particular in the spatial distribution of the stray field. In particular, it is possible to detect or ascertain the magnitude of the stray field in different spatial directions. To this end, the sensor elements may have different alignments.

The disclosure also seeks to improve an optical system.

In one aspect, the disclosure provides an optical system including a plurality of component parts and at least one sensor device for detecting a stray magnetic field, wherein the sensor device is a constituent part of a forward control device for controlling the positioning of at least one of the component parts of the optical system.

Such an optical system facilitates improved positioning, in particular more precise positioning, of the component parts. In particular, the method described above can be used for positioning the component parts of the optical system.

According to one aspect of the disclosure, the sensor device includes a plurality of sensor elements for detecting the spatial distribution of the stray field. In particular, it may include two, three or more sensor elements.

In particular, Hall sensors may serve as sensor elements. Other sensor elements are likewise possible, for example MDRs (magnetic dependent resistors) and SQUIDs (superconducting quantum devices) amongst others.

According to a further aspect of the disclosure, the sensor device is arranged in such a way that it has a distance of no more than 100 mm, in particular no more than 10 mm, in particular no more than 1 mm, from a component part that is influenceable by the stray field. The influence of the stray field on the positioning of the component part can be compensated more accurately as the distance between the sensor device and this component part influenced by the stray field decreases.

According to a further aspect of the disclosure, an actuating member of a displacement device for compensating the effect of the stray magnetic field on the positioning of at least one of the component parts of the optical system has a control bandwidth of at least 1 Hz, in particular at least 10 Hz, in particular at least 30 Hz, in particular at least 50 Hz, in particular at least 100 Hz, in particular at least 200 Hz, in particular at least 300 Hz, in particular at least 500 Hz. The desired control bandwidth can be chosen depending on the expected disturbance frequency.

A high control bandwidth allows better correction of disturbances. A high control bandwidth for minimizing residual optical aberrations is advantageous, particularly in the case of high-frequency excitations. Here, a residual optical aberration is understood to be the deviation from an ideal image, caused by a disturbance in the positioning of one or more of the optical component parts.

According to a further aspect of the disclosure, the optical system includes at least one regulating device which is signal-connected to the sensor device for detecting the stray magnetic field and, in addition thereto, to a sensor device for detecting the positioning of one of the component parts.

In particular, regulating a positioning of one or more of the component parts of the optical system is possible with the aid of the sensor device for detecting the stray magnetic field, within the scope of which regulation use is made not only of position data detected by sensors, in particular within a feedback loop, but also information items about the stray magnetic field ascertained in addition thereto, for the purposes of regulating the positioning of one or more of the component parts of the optical system. In particular, the component parts are optical component parts. The information items ascertained by the sensor device about the stray magnetic field can be transferred as correction signals to a controller for regulating the positioning of one or more of the component parts of the optical system.

The data detected by the sensor device for detecting the stray magnetic field can initially still be processed further to this end via a control device, in particular with a computing unit.

According to a further aspect of the disclosure, the optical system includes an illumination optical unit of a projection exposure apparatus and/or a projection optical unit of a projection exposure apparatus. In particular, it can be formed by an illumination optical unit of a projection exposure apparatus, a projection optical unit of a projection exposure apparatus or a projection exposure apparatus.

The advantages of the disclosure have a particularly good effect in such optical systems. Particularly in the case of EUV projection exposure apparatuses and the constituent parts thereof, highly precise positioning of the component parts is desirable in order to ensure the optical quality, in particular the precision of these apparatuses.

BRIEF DESCRIPTION OF THE DRAWINGS

Further details and advantages of the disclosure will become apparent from the description of exemplary embodiments with reference to the figures. In the figures.

DESCRIPTION OF EXEMPLARY EMBODIMENTS

Below, the general design and the constituent parts of a projection exposure apparatus 1 will initially be described with reference to FIG. 1.

Figure 1:
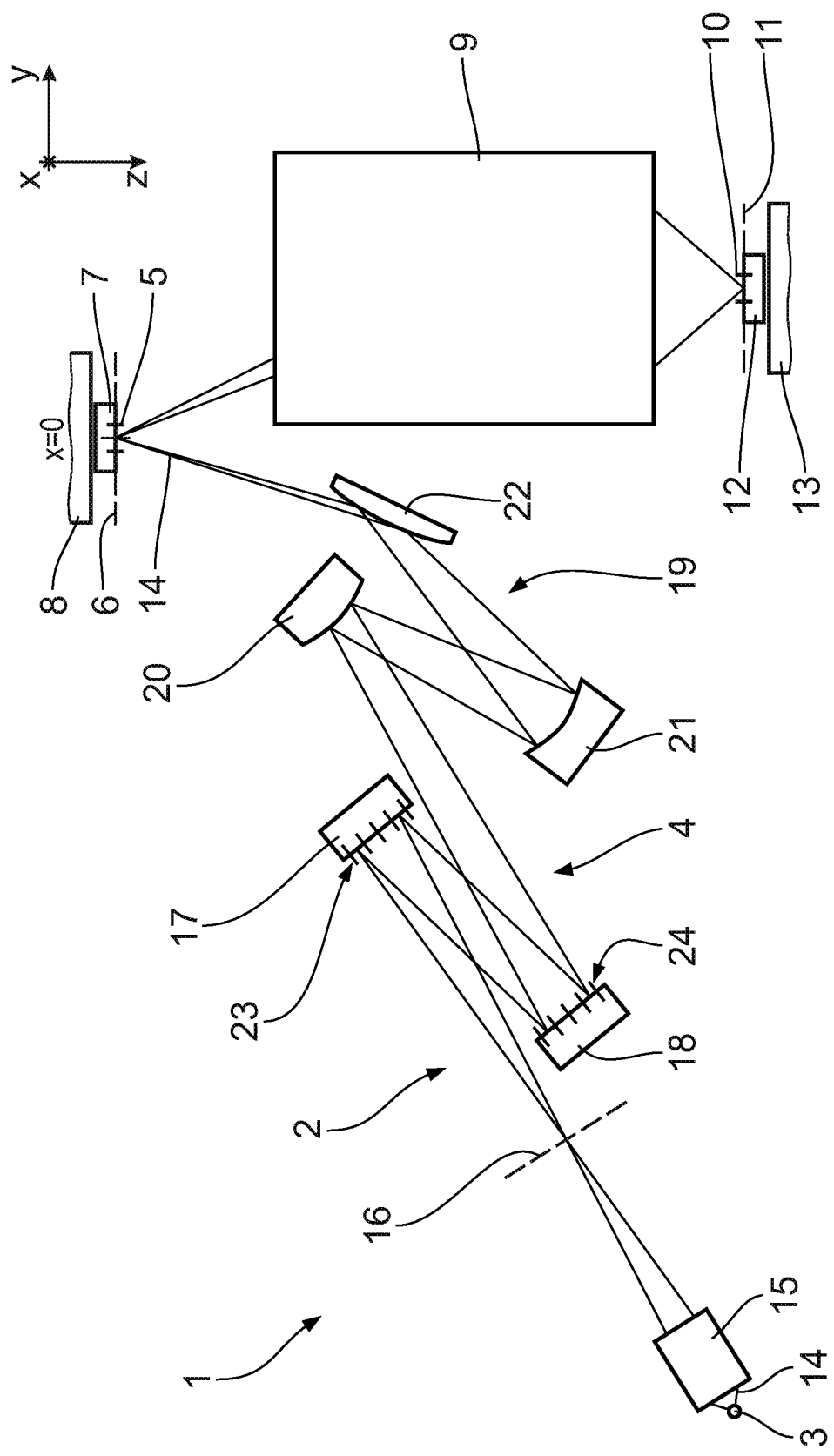
FIG. 1 schematically shows a meridional section through a projection exposure apparatus for EUV projection lithography.

FIG. 1 schematically shows a microlithographic projection exposure apparatus 1 in a meridional section. An illumination system 2 of the projection exposure apparatus 1 has, besides a radiation source 3, an illumination optical unit 4 for the exposure of an object field 5 in an object plane 6. Here, a reticle 7 arranged in the object field 5, which reticle is held by a reticle holder 8 (only depicted in sections here), is exposed. A projection optical unit 9 serves for imaging the object field 5 into an image field 10 in an image plane 11. A structure on the reticle 7 is imaged on a light-sensitive layer of a wafer 12 held by a wafer holder 13 that is likewise depicted schematically here, the wafer being arranged in the region of the image field 10 in the image plane 11.

The radiation source 3 is an EUV radiation source having an emitted used radiation in the range of between 5 nm and 30 nm. The radiation source 3 can also be a radiation source having emitted used radiation in a different wavelength range. However, the highly precise positioning of an optical component part according to the disclosure is particularly advantageous for use in an EUV projection exposure apparatus. This can be a plasma source, for example a GDPP (Gas Discharge Produced Plasma) source or an LPP (Laser Produced Plasma) source. A radiation source based on a synchrotron can also be used for the radiation source 3. Information about such a radiation source is able to be found by the person skilled in the art for example from U.S. Pat. No. 6,859,515 B2. EUV radiation 14 emerging from the radiation source 3 is focused by a collector 15. Downstream of the collector 15, the EUV radiation 14 propagates through an intermediate focal plane 16 before being incident on a field facet mirror 17 with a multiplicity of field facets 23. The field facet mirror 17 is arranged in a plane of the illumination optical unit 4 which is optically conjugate with respect to the object plane 6.

The EUV radiation 14 is also referred to hereinafter as illumination light or as imaging light.

Downstream of the field facet mirror 17, the EUV radiation 14 is reflected by a pupil facet mirror 18 with a multiplicity of pupil facets 24. The pupil facet mirror 18 is arranged in a pupil plane of the illumination optical unit 4, which is optically conjugate with respect to a pupil plane of the projection optical unit 9. Field facets of the field facet mirror 17 are imaged into the object field 5 with the aid of the pupil facet mirror 18 and an imaging optical assembly in the form of a transfer optical unit 19 with mirrors denoted by 20, 21 and 22 in the order of the beam path. The last mirror 22 of the transfer optical unit 19 is a grazing incidence mirror. The pupil facet mirror 18 and the transfer optical unit 19 form sequential optics for transferring the illumination light 14 into the object field 5. It is possible to dispense with the transfer optical unit 19, in particular if the pupil facet mirror 18 is arranged in an entry pupil of the projection optical unit 9.

In order to describe positional relationships more easily, a Cartesian xyz-coordinate system is plotted in FIG. 1. The x-axis extends perpendicularly to the plane of the drawing into the latter in FIG. 1. The y-axis extends toward the right. The z-axis extends downward. The object plane 6 and the image plane 11 both extend parallel to the xy-plane.

The reticle holder 8 is displaceable in a controlled manner in such a way that, during the projection exposure, the reticle 7 can be displaced in the object plane 6 in a displacement direction parallel to the y-direction. Accordingly, the wafer holder 13 is displaceable in a controlled manner in such a way that the wafer 12 is displaceable in the image plane 11 in a displacement direction parallel to the y-direction. As a result of this, the reticle 7 and the wafer 12 can be scanned through the object field 5 and through the image field 10, respectively. Below, the displacement direction is also referred to as scanning direction. The shifting of the reticle 7 and of the wafer 12 in the scanning direction can preferably be carried out in a manner synchronous to one another.

The projection optical unit 9 includes at least one optical component part for imaging the object field 5 into the image field 10. The optical component part is a mirror, in particular. The latter preferably carries a multilayer coating for optimizing the reflectivity of the wavelength of the used radiation 14.

The projection optical unit 9 includes at least four mirrors, in particular. It may include five, six, seven, eight or more mirrors. Here, one or more of the mirrors may have a passage opening for the used radiation 14. In particular the mirror arranged closest to the image field 10 and forming the penultimate mirror in the beam path of the projection optical unit 9 may have a passage opening for the used radiation 14.

During use of the projection exposure apparatus 1, the reticle 7 and the wafer 12, which bears a coating that is light-sensitive to the illumination light 14, are provided. Subsequently, at least one portion of the reticle 7 is projected onto the wafer 12 with the aid of the projection exposure apparatus 1. When projecting the reticle 7 onto the wafer 12, the reticle holder 8 and/or the wafer holder 13 can be displaced in a direction parallel to the object plane 6 or parallel to the image plane 11. The displacement of the reticle 7 and of the wafer 12 can preferably be carried out in a manner synchronous to one another. Finally, the light-sensitive layer on the wafer 12 that has been exposed with the illumination light 14 is developed. A microstructured or nanostructured component part, in particular a semiconductor chip, is produced in this way.

A method for positioning a component part of the projection exposure apparatus 1, in particular of the illumination optical unit 4, of the illumination system 2 or of the projection optical unit 9, is described below.

It was determined that stray magnetic fields 25 arise if use is made of electromagnetic components, particularly in the region of the reticle holder 8 and/or the wafer holder 13 and/or in the region of the optical component parts of the projection exposure apparatus 1. The stray magnetic fields 25 are illustrated schematically in FIGS. 2 to 6. The stray magnetic fields 25 may interact with the component parts of the projection exposure apparatus 1, in particular with the optical component parts of the illumination optical unit 4 and/or the projection optical unit 9. In particular, a force interaction with component parts of the optical system and/or a change in length of holding structures may arise, in particular also on account of magnetostrictive effects. In general, both effects occur, in particular, on components with ferromagnetic constituent parts.

Figure 4:
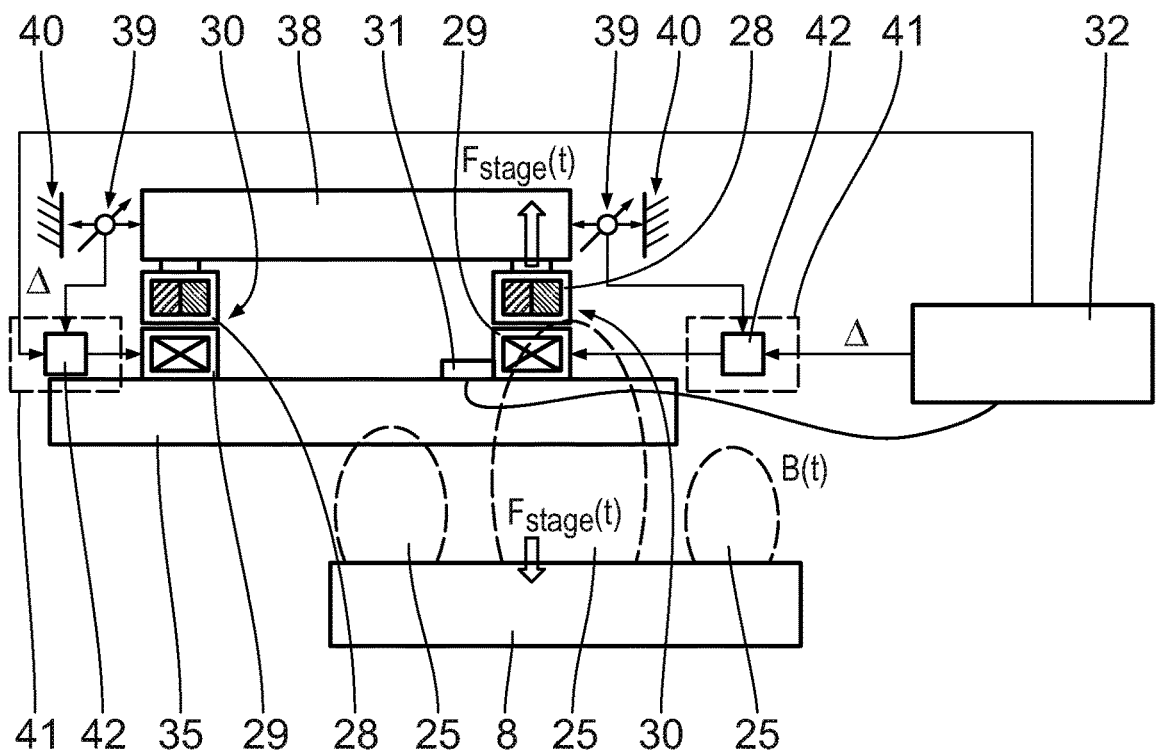
FIG. 4 shows a further alternative to the embodiment according to FIG. 2, wherein the correction signal is applied to an actuator of an active optical component part.

Moreover, there may be a force interaction between the stray magnetic fields 25 and permanent magnets 26 of a gravity compensation device 27 (see FIG. 5) and/or permanent magnets 28 and/or coils 29 of actuators 30 (see FIG. 4). The actuators 30 form actuating members of a displacement device for displacing the optical component part 38. The interaction between the stray magnetic fields 25 and the component parts of the projection exposure apparatus 1 can lead to unwanted disturbances in the positioning of these component parts. In this respect, what produces the stray magnetic fields 25 is unimportant as a matter of principle. However, if the cause of the stray fields 25 is known, this can be taken into account in the models still described in more detail below.

According to the disclosure, provision is made for the unwanted disturbance in the positioning, caused by the interaction, of one or more of the component parts of the projection exposure apparatus 1 to be compensated via correction signals. In particular, it is possible to compensate an unwanted disturbance in the positioning of a passive component part via correction signals. It is also possible to compensate an unwanted disturbance in the positioning of an active component part via correction signals.

Here, a passive component part is understood to mean a fixed component part, i.e., a component part not mounted in displaceable fashion. Here, an active component part is understood to mean a displaceable component part, in particular a component part that is controllably displaceable via an actuator device.

A feedforward control model is provided for determining the correction signals. In particular, this can be a force feedforward control model or a position feedforward control model or a combination of such models.

In the case of passive component parts, which are not controllably displaceable via an actuator device, a correction signal for displacing the entire component part can be applied to a holding device of same, provided the holding device has mechanism suitable to this end. As an alternative thereto, an unwanted disturbance in the positioning of a passive component part may optionally be at least partly compensated at a different point in the system.

Both feedforward control models can be implemented in active component parts, which are controllably actuatably displaceable.

In addition to the feedforward control described in more detail below, the actuatably displaceable component parts may also have controllers with feedback, i.e., control loops, for the purposes of positioning thereof. Here, position sensors 39, in particular, serve as sensors. The corresponding details are illustrated only schematically in the figures for reasons of clarity.

With the aid of the method described in more detail below, it is possible to reduce, in particular minimize, the effect of the stray magnetic field 25 on the positioning of one or more of the component parts of the projection exposure apparatus 1, in particular the effect on active component parts, in particular the actuators thereof, and/or the effect on passive component parts, in particular on account of magnetostrictive effects or on account of a reluctance force acting thereon. To this end, provision is made for a correction signal to be determined for an actuating member of a displacement device of one or more of the component parts of the projection exposure apparatus 1. The stray magnetic field 25 is detected via one or more sensor elements 31 for the purposes of determining the correction signal. The sensor elements 31 from constituent parts of a sensor device. The stray magnetic field, in particular the magnitude and direction thereof, is ascertained from the data detected via the sensor elements 31. The effect of the stray magnetic field 25 on the positioning of one or more of the component parts of the projection exposure apparatus 1 is ascertained with the aid of a feedforward control model. To this end, a control device 32 is depicted schematically in the figures. The control device 32 may include, in particular, a computing unit and/or a memory.

The control device 32 is used to evaluate the measurement signal of the sensor device for interpreting the stray magnetic field 25. A prediction of the disturbance in the positioning of one or more of the component parts of the projection exposure apparatus 1 is made on the basis of stored optical sensitivities. In particular, a prediction is made in relation to the disturbance in the optical properties of the projection exposure apparatus 1 connected therewith. A correction signal for correcting the positioning of one or more of the component parts of the projection exposure apparatus 1 is ascertained from this prediction. Here, it is possible to carry out the correction on the optical component parts influenced by the stray magnetic field 25 themselves. In this case, a complete correction of the disturbance is possible. Provision can also be made for the disturbance of a certain optical component part to be reduced, in particular compensated, by a correction signal for influencing another optical component part. A complete correction is not always possible in this case.

Provided the disturbance of one of the optical component parts is corrected by a correction signal for displacing another optical component part, provision is made for a correction recipe to be initially calculated and for an actuating signal to be determined therefrom.

According to the alternatives illustrated in the figures, the control device 32 for correcting the effect of the stray magnetic field 25 on the positioning of one or more of the component parts of the projection exposure apparatus 1 with the aid of the feedforward control model is illustrated as a separate component part that is separated from the possibly present control device 41. This serves primarily to explain the correction method. The control device 32 and the control device 41 may also be embodied as a common component part. In particular, they can be signal-connected to a common controller 42 for producing a regulating signal. This is advantageous, in particular, if the correction of the disturbance is carried out on the affected optical component part itself.

According to an advantageous alternative, the control device 32 is signal-connected to the controller 42 of the control device 41 for controlling the actuators 30 of one of the displaceable optical component parts of the projection exposure apparatus 1. In particular, the control device 32 serves to transmit a correction signal to a controller 42 of the control device 41.

Since the actually present stray magnetic field 25, in particular the magnitude and direction thereof, is ascertained with the aid of the sensor device, it is possible to dispense with modeling of same. It was found that the use of the sensor device leads to a substantially improved ascertainment, in particular a substantially more precise ascertainment, of the actual stray magnetic field 25. In particular, changes in the stray magnetic field 25, which may occur on account of aging effects of the components of the stray field producer, for example, can also be ascertained with the aid of the sensor device. Moreover, the ascertainment of the actual stray magnetic field 25 with the aid of the sensor device is independent of a priori assumptions of a model for modeling a corresponding stray field. Moreover, it is independent of model errors on account of manufacturing and/or assembly inaccuracies of the stray field producer and/or simulation inaccuracies of a corresponding model.

The feedforward control model for ascertaining the relationship between the stray magnetic field 25 and its effect on the positioning of one or more of the component parts of the projection exposure apparatus 1 can be produced by way of measurements, in particular calibration measurements, or with the aid of a simulation. In particular, the results of the calibration measurements can be stored in the aforementioned memory of the control device 32.

Different alternatives of the structural implementation of the method according to the disclosure are described below.

In all of the alternatives described in an exemplary fashion below, the stray magnetic field 25 is caused by components of the reticle holder 8. This should not be understood to be restrictive. The stray magnetic field 25 may also be caused by components of the wafer holder 13 and/or further components of the projection exposure apparatus 1 with permanent-magnetic or electromagnetic elements. What produces the stray magnetic field 25 plays no role for the method according to the disclosure as a matter of principle. However, if the source of the stray field of 25 is known, it can be taken into account in the feedforward control model.

Figure 2:
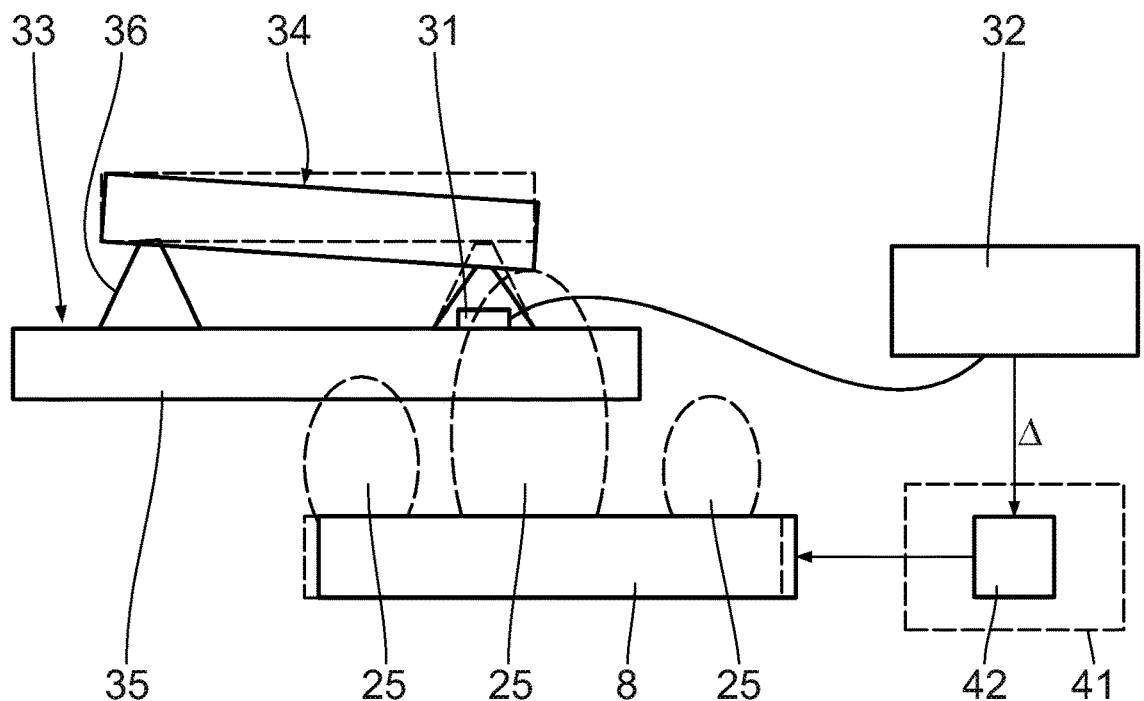
FIG. 2 schematically shows an optical system with feedforward control for a positioning of a component part, wherein a sensor element is arranged at a passive optical component part and a correction signal is produced to correct the positioning of a holding device, for example a reticle holder or a wafer holder.

In the alternative illustrated in FIG. 2, the sensor element 31 is arranged in the region of a holding device 33 of an optical component part 34 of the projection exposure apparatus 1. In particular, the holding device 33 includes a rigid platform 35, which is also referred to as a "frame". Moreover, the holding device 33 includes holding struts 36 arranged on the platform. In respect of details, reference is made in exemplary fashion of the description of DE 10 2012 202 169 A1 and the description of DE 10 2012 202 170 A1, the entirety of which are herewith integrated into the present application.

The effect of the stray magnetic field 25 on the positioning of the optical component part 34 is illustrated in an exemplary and greatly exaggerated manner in FIG. 2.

The optical component part 34 can be, in particular, a mirror, in particular a mirror of the illumination optical unit 4 or of the projection optical unit 9.

In the variant illustrated in FIG. 2, a correction signal $\Delta$ for displacing the reticle holder 8 is determined from the effect of the stray magnetic field 25 on the positioning of the optical component part 34, ascertained via the control device 32. This is a rigid body correction. This allows low orders to be corrected, in particular the so-called overlay and the focus. The correction signal $\Delta$ is transferred from the control device 32 to a control device 41 for controlling the displacement of the reticle holder 8, in particular to a controller 42 of the control device 41.

Preferably, the reticle holder 8 has a plurality of degrees of freedom for correcting the positioning with the aid of the correction signal. In particular, it may have three translational degrees of freedom for correcting the positioning with the aid of the correction signal. Moreover, it may have, in particular, three rotational degrees of freedom for correcting the positioning with the aid of the correction signal.

In the alternative illustrated in FIG. 2, a correction signal in the form of a positioning signal, in particular, is determined.

In particular, the correction signal $\Delta$ is used to correct the positioning of a component part that differs from the component part primarily responsible for the production of the stray magnetic field 25.

Figure 3:
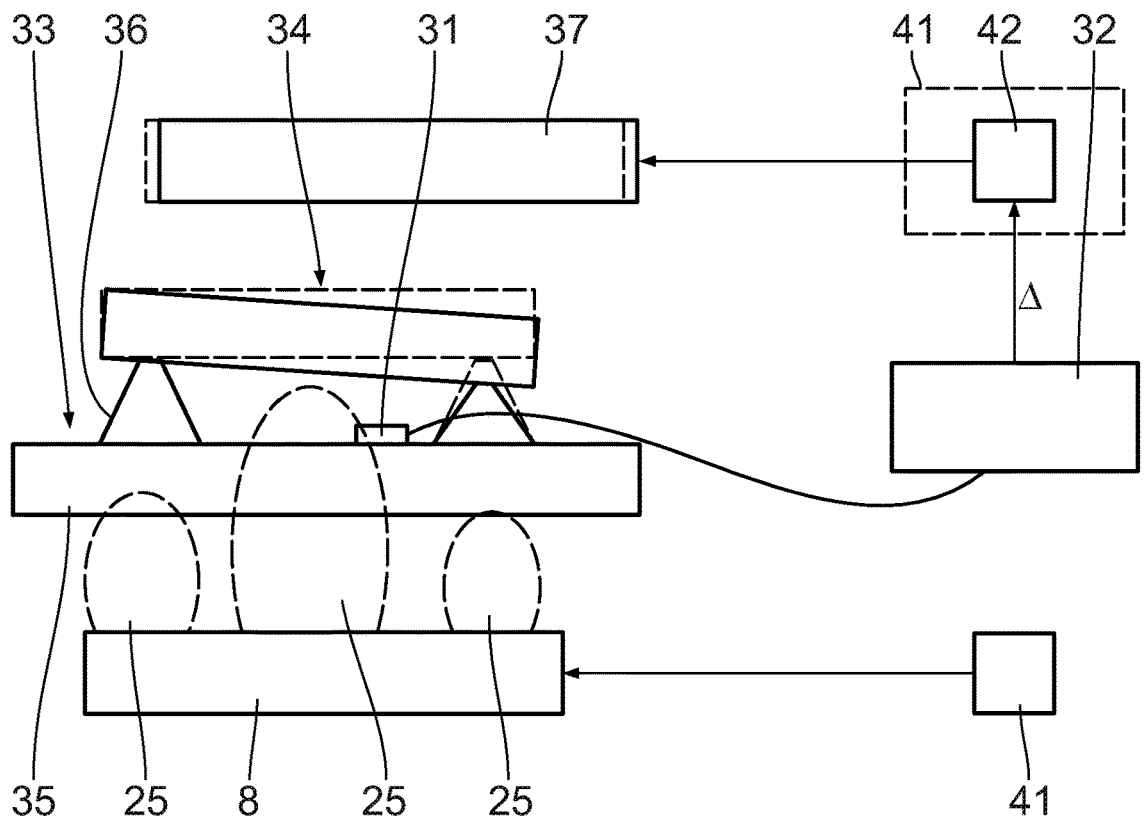
FIG. 3 shows an alternative to the embodiment according to FIG. 2.

The alternative illustrated in FIG. 3 substantially corresponds to that illustrated in FIG. 2, to the description of which reference is hereby made. However, in the alternative illustrated in FIG. 3, the correction signal $\Delta$ is used to correct the positioning of a platform 37, which differs from the reticle holder 8. In particular, the platform 37 can be the wafer holder 13. It may also relate to a holding device for holding a further optical component part, in particular a mirror, which is not illustrated in the figure.

Platform 37 and reticle holder 8 may also be precisely interchanged. In particular, it is possible for the wafer holder 13 to produce the stray magnetic field 25 instead of the reticle holder 8 and for a correction signal $\Delta$ to be produced for correcting the positioning of the reticle holder 8.

In the alternative illustrated in FIG. 4, the correction signal is applied to the actuator 30. In particular, it serves to correct the positioning of the active optical component part 38.

The correction signal ascertained via the control device 32 serves, in particular, to correct the control signal, in particular the regulating signal, for positioning the active optical component part 38. The control or regulating signal for positioning the active optical component part 38 is generally produced by a control device, not illustrated in the figures, for controlling the optical system.

An actuator is illustrated in exemplary fashion in FIG. 4, the coils 29 of the actuator being securely connected to the platform 35 in this case while the permanent magnets 28 are arranged on the optical component part 38 and are displaceable together with the latter. Such an arrangement is also referred to as a moving magnet actuator. A reverse arrangement, in which the permanent magnets 28 are securely arranged on the platform 35 and the coils 29 are arranged on the optical component part 38 is likewise possible. This is also referred to as a moving coil actuator. Other embodiments of the actuators are likewise possible. In particular, the method according to the disclosure is not restricted to a certain type of actuators.

In the alternative illustrated in FIG. 4, position sensors 39 for detecting the position of the optical component part 38 are plotted schematically. In particular, the position of the optical component part 38 can be detected relative to a fixed reference point of the projection exposure apparatus 1, for example a delimiting wall 40 of same.

In the alternative illustrated in FIG. 4, a force feedforward control model is used the correction signal for the actuator 30. Here, the correction signal is present in the form of a force signal $\Delta F$ for the force exerted on the optical component part 38 via the actuator 30.

Figure 5:
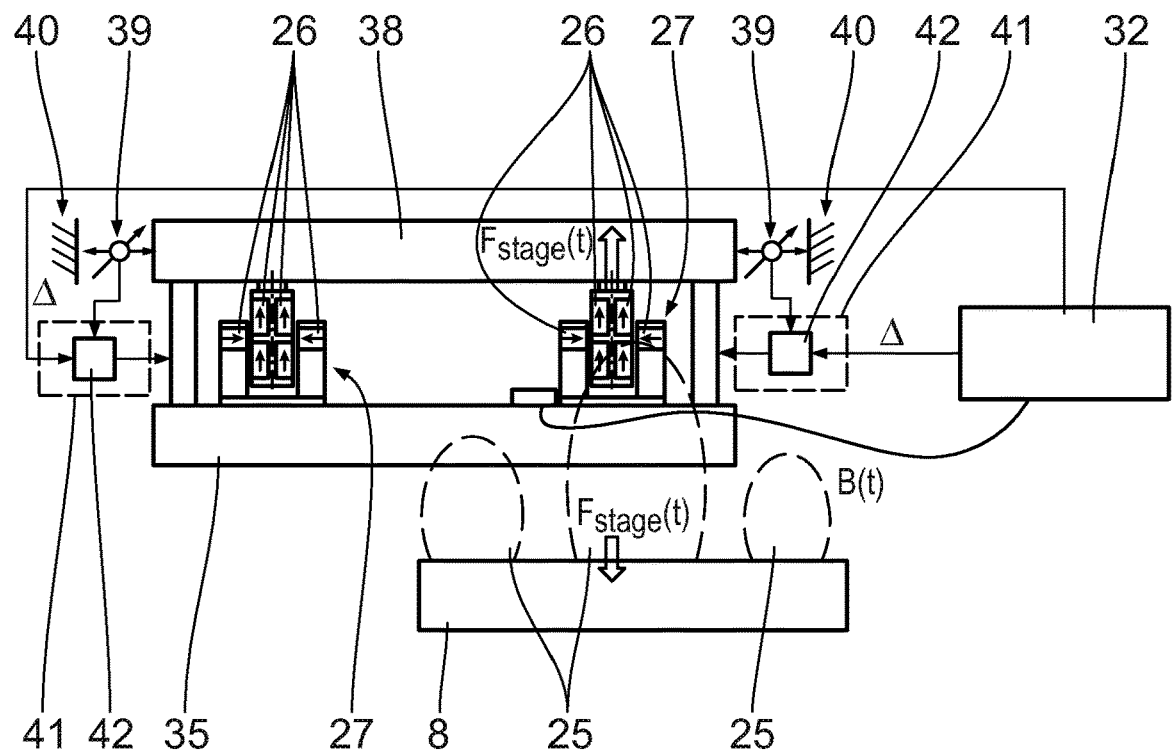
FIG. 5 shows an alternative to the embodiment according to FIG. 4, wherein the correction signal is applied to an alternative/parallel manipulator to the mirror position manipulator.

The alternative illustrated in FIG. 5 substantially corresponds to that illustrated in FIG. 4, to the description of which reference is hereby made. Instead of the actuators 30, the optical component part 38 is mounted with a gravity compensation device 27 in the alternative illustrated in FIG. 5.

The arrangement of the permanent magnets 26 of the gravity compensation device 27 illustrated in FIG. 5 should not be construed as restrictive. An alternative arrangement of the permanent magnets 26 is likewise possible.

Figure 6:
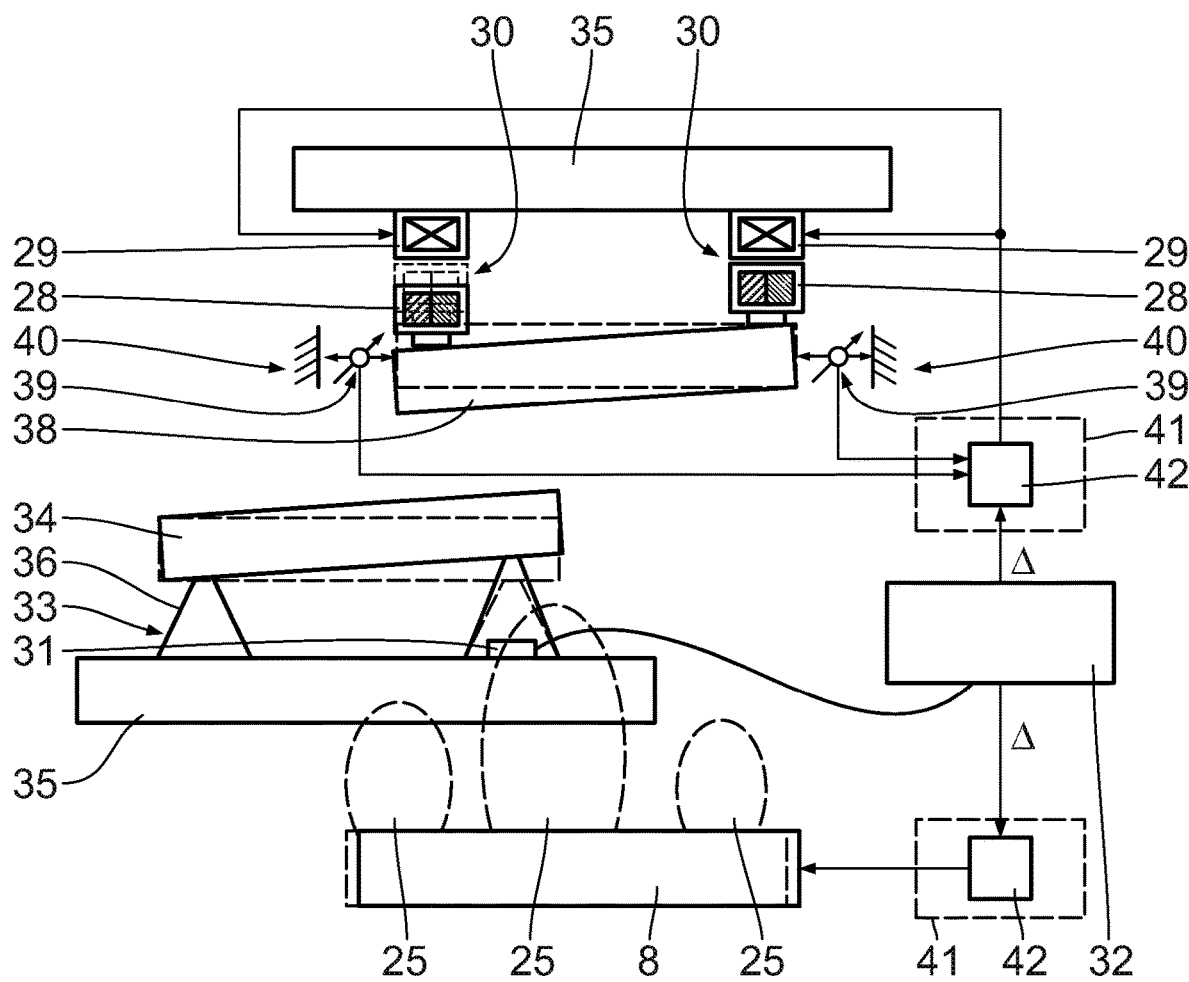
FIG. 6 shows an alternative to the embodiment according to FIG. 3, wherein the compensation signal is applied to an actuator of an active optical component part in order to correct the disturbance by another optical element.

The alternative illustrated in FIG. 6 substantially corresponds to the alternative illustrated in FIG. 3, to the description of which reference is hereby made. Instead of a passive component part in the form of the platform 37, the positioning of the active optical component part 38 is corrected in the alternative according to FIG. 6. To this end, the control device 41 of the displacement device for positioning the optical component part 38 is actuated by the correction signal $\Delta$.

In principle, the positioning of the platform 35 can be corrected via a correction signal $\Delta$ in the alternative illustrated in FIG. 6 as well.

Producing a plurality of correction signals via the control device 32 is also possible. As indicated in exemplary fashion, it is possible to influence both the positioning of passive component parts and the positioning of active component parts via correction signals. Here, positioning correction signals $\Delta r$ and/or force correction signals $\Delta F$ are possible. A combination of a positioning correction signal $\Delta r$ and a force correction signal $\Delta F$ is also possible.

The various alternatives are also combinable with one another.

It is also possible to combine a plurality of the different alternatives illustrated in the figures in a single projection exposure apparatus 1.

Further details of the disclosure are described below. In particular, the feedforward control model is a first-order feedforward control model. This should be understood to mean a model in which use is not only made of a pure FE model (finite element model), which is also referred to as a zero-order model, for the purposes of determining the correction signals, but in which the data measured via the sensor device serve as an input for the model, in particular in which the data are used to calibrate the model.

In the alternatives illustrated in FIGS. 2 and 3, the effect of the stray magnetic field 25 on a passive optical component part 34 is achieved by correcting the positioning of another component part of the projection exposure apparatus 1. This is possible, in particular, if the component part whose positioning is corrected with the aid of the correction signal and the component part 34, the positioning of which is disturbed by the stray magnetic field 25, have complementary sensitivities. Otherwise, a correction of the optical effect is not precluded but generally incomplete.

First order aberrations (lens offset or overlay), in particular, can be corrected by adjusting the wafer and/or the reticle. A malpositioning in particular, in particular a tilt of an optical component part, for example of a mirror, leads, inter alia, to a line offset in the image field, which can be corrected very well via a correcting movement of the wafer and/or the reticle.

If a disturbance of one of the component parts of the projection exposure apparatus 1 is corrected by other component parts of the projection exposure apparatus 1 that differ therefrom, provision can be made for the correction signal to be calculated in such a way that a possibly remaining residual aberration is less than a predetermined limit value, in particular minimized.

In principle, any measuring mechanism, via which the magnitude and/or direction of the stray magnetic field 25 is directly or indirectly detectable, can serve as sensor element 31.

In particular, a force feedforward control model can be provided should at least one of the component parts of the projection exposure apparatus 1 to be positioned be provided with a displacement unit with actuator-type actuating members, via which a force is exertable on the component part, which force counteracts the external action of force.

If use is made of a position feedforward control model for positioning a passive or active component part, provision is made of a displacement device with actuating members for displacing a holding device, in particular the reticle holder 8 and/or the wafer holder 13 and/or a platform 35, 37.

In principle, it is also possible to use a position feedforward control model for correcting the positioning of active optical component parts 38. However, the use of a force feedforward control model is advantageous in this case since errors of the correction signal can be removed by closed-loop control with the aid of a control loop for regulating the positioning of the active optical component part 38.

What applies to all alternatives is that the sensor elements 31 should be positioned as densely as possible at the component of the projection exposure apparatus 1 that is influenced by the stray field 25. This can improve the accuracy for determining the correction signal. The distance between the sensor elements 31 and the components influenced by the stray field 25 is, in particular, at most 100 mm, in particular at most 10 mm, in particular at most 1 mm.

What likewise applies to all alternatives is that the control device 32 preferably has a high control bandwidth. As a result of this, the correction of disturbances in the positioning of the component part is improved. In particular, a high control bandwidth is advantageous for correcting high-frequency excitations. In particular, the control bandwidth is at least 1 Hz, in particular at least 10 Hz, in particular at least 30 Hz, in particular at least 50 Hz, in particular at least 100 Hz, in particular at least 200 Hz, in particular at least 300 Hz, in particular at least 500 Hz.

Particularly if use is made of a position feedforward control model, the component of the projection exposure apparatus 1 whose position should be influenced with the aid of the correction signal should be able to follow the dynamic malpositions. In particular, it should have a high control bandwidth.

The control bandwidth depends on the frequency of the disturbance. The disturbance frequency depends on the speed and the spatial magnetic field distribution. Disturbances in the region of 100 Hz are expected, which should be corrected with a control bandwidth of 200 Hz, better 500-1000 Hz. Disturbances in the region of 10 Hz can be corrected by a control bandwidth of 100 Hz; disturbances in the 1 Hz region can be corrected by a 10 Hz bandwidth.

Below, different alternatives of the disclosure will be described again on the basis of FIGS. 7 to 10. The different alternatives substantially correspond to those already described above, which are referred to herewith. Component parts are sometimes illustrated differently for the purposes of elucidating different aspects of the disclosure.

Figure 7:
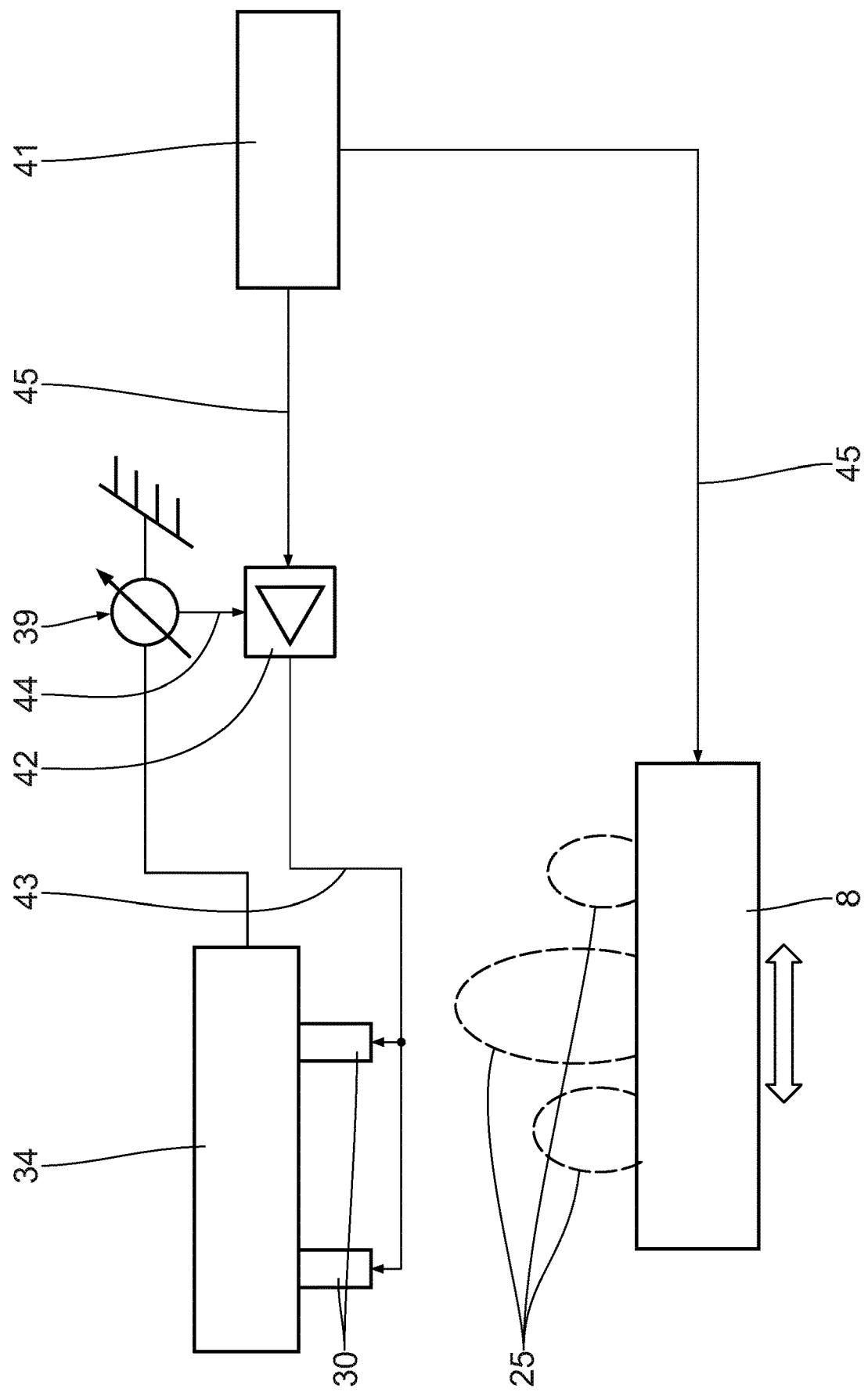
FIG. 7 shows a schematic illustration of an optical system with controlled positioning of an optical component part without taking magnetic fields into account.

FIG. 7 schematically illustrates the alternative of a closed-loop control of the positioning of the optical component part 34 and of the reticle holder 8, without taking account of magnetic fields 25. Via the control device 41, a positioning signal 45 for positioning the reticle holder 8 is guided to the latter.

Moreover, a positioning signal 45 is guided to the controller 42 for regulating the positioning of the optical component part 34. A regulating signal 43 is guided to the actuators 30 of the optical component part 34 via the controller 42. Moreover, the controller 42 is provided with a sensor signal 44 by the position sensor 39. The positioning signal 45, which is used for transmission by the control device 41 and the controller 42, is, in particular, the setpoint value for positioning the optical component part 34.

Figure 8:
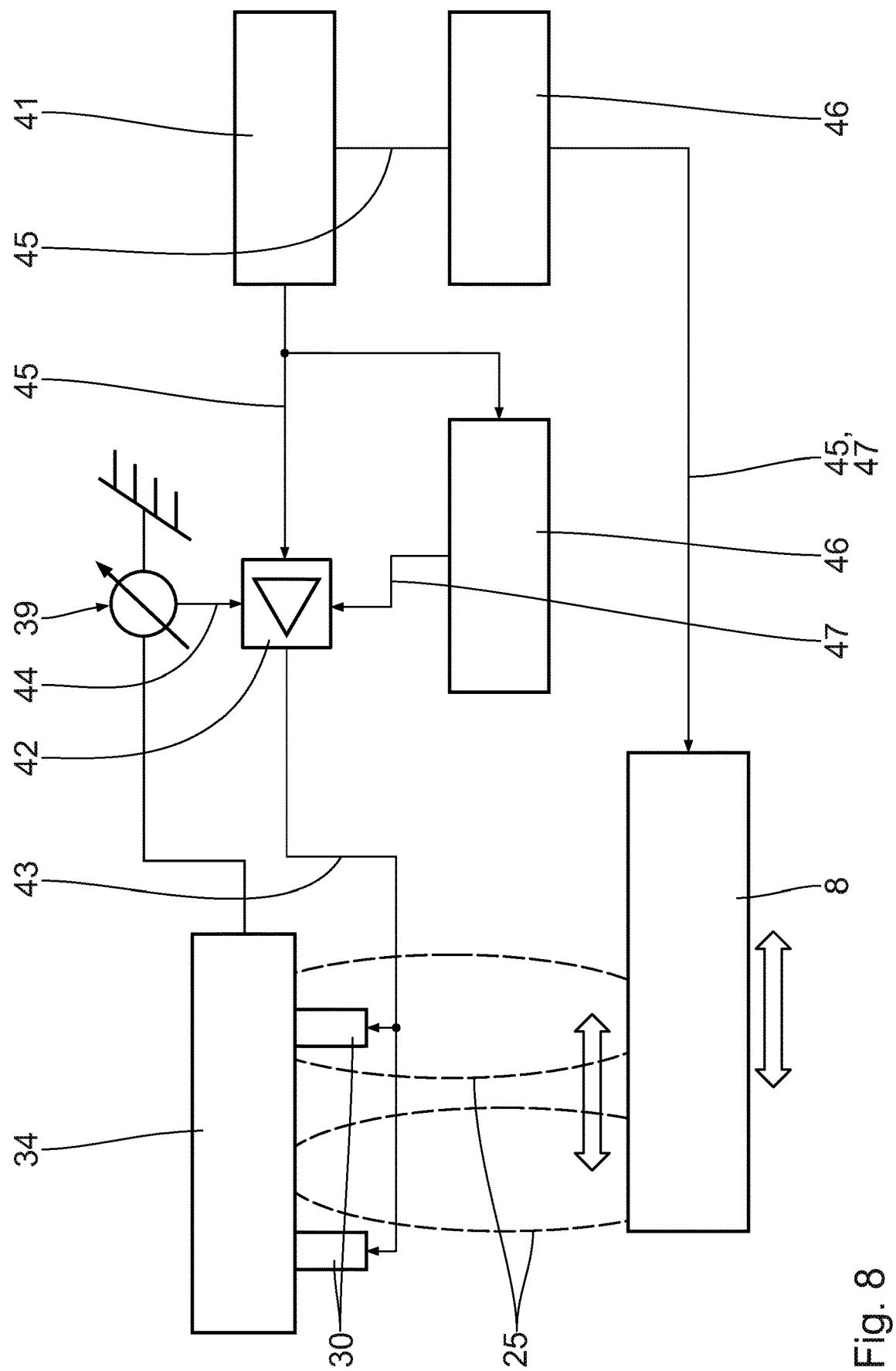
FIG. 8 shows a schematic illustration corresponding to FIG. 7, with a feedforward control for taking magnetic fields into account.

In the alternative illustrated in FIG. 8, the influence of the stray magnetic fields 25 is taken into account, but only in a feedforward control without feedback. A model 46 for the magnetic interaction, illustrated schematically in FIG. 8, serves, in particular, to take account of the effect of the stray magnetic fields 25. One or more correction signals 47 are ascertained with the aid of this model 46. In particular, the correction signals 47 can serve as an input for the controller 42. In particular, they can be incorporated into the regulating signal 43, i.e., influence the latter.

Figure 9:
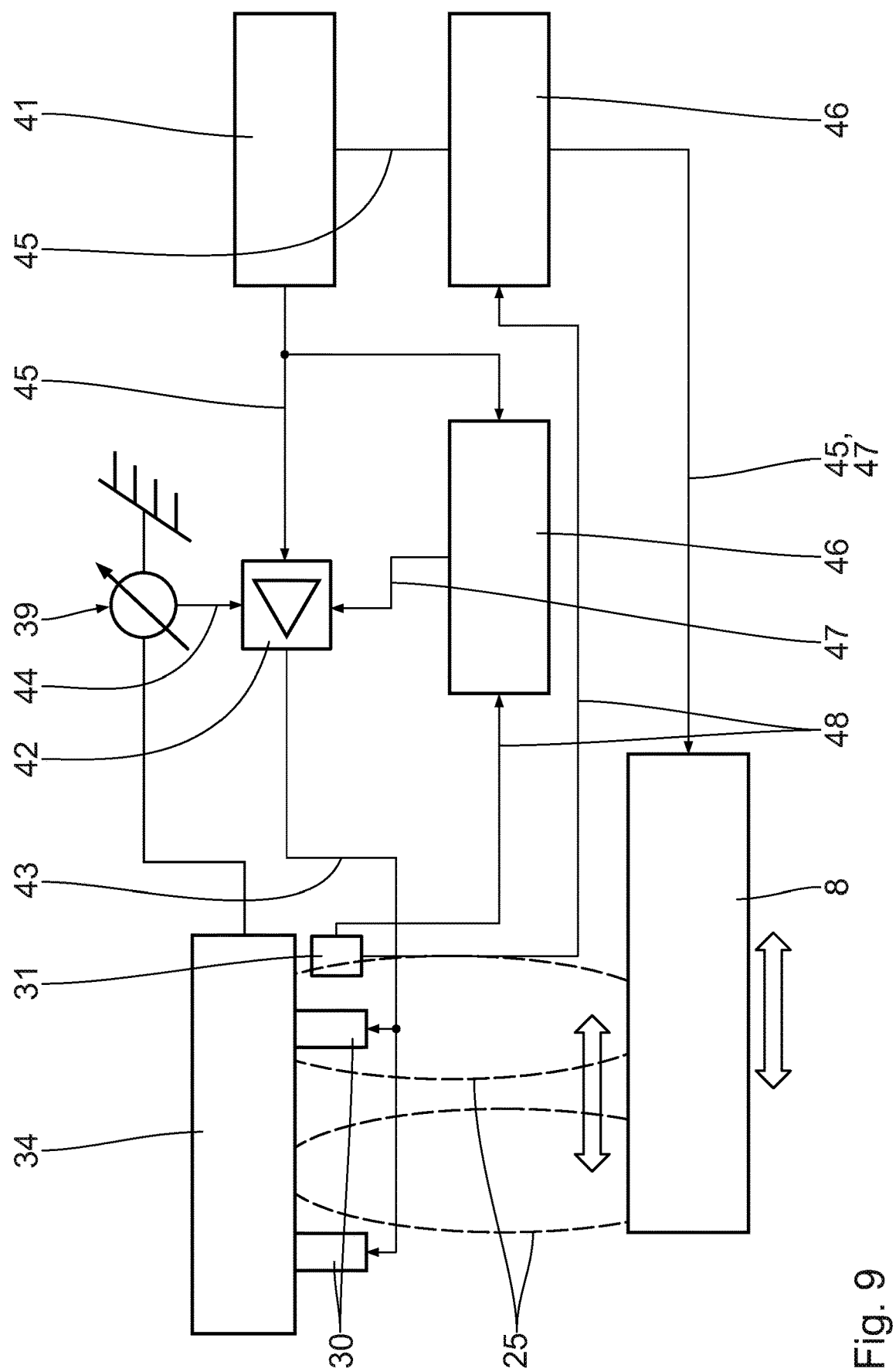
FIG. 9 shows an illustration according to FIG. 8, wherein additional provision is made of a sensor for calibrating the model for the magnetic interaction.

FIG. 9 illustrates an alternative according to FIG. 8, in which, however, additional provision is made of a sensor element 31 for detecting the stray magnetic field 25 in the region of the optical component part 34. The sensor element 31 supplies input signals 48 for the model 46 for the magnetic interaction. In particular, the model 46 can be calibrated with the aid of the input signals 48.

While FIG. 8 schematically illustrates the alternative of a zero-order model 46, FIG. 9 schematically shows the alternative of a first-order model 46. For further details, reference should be made to the description above.

Figure 10:
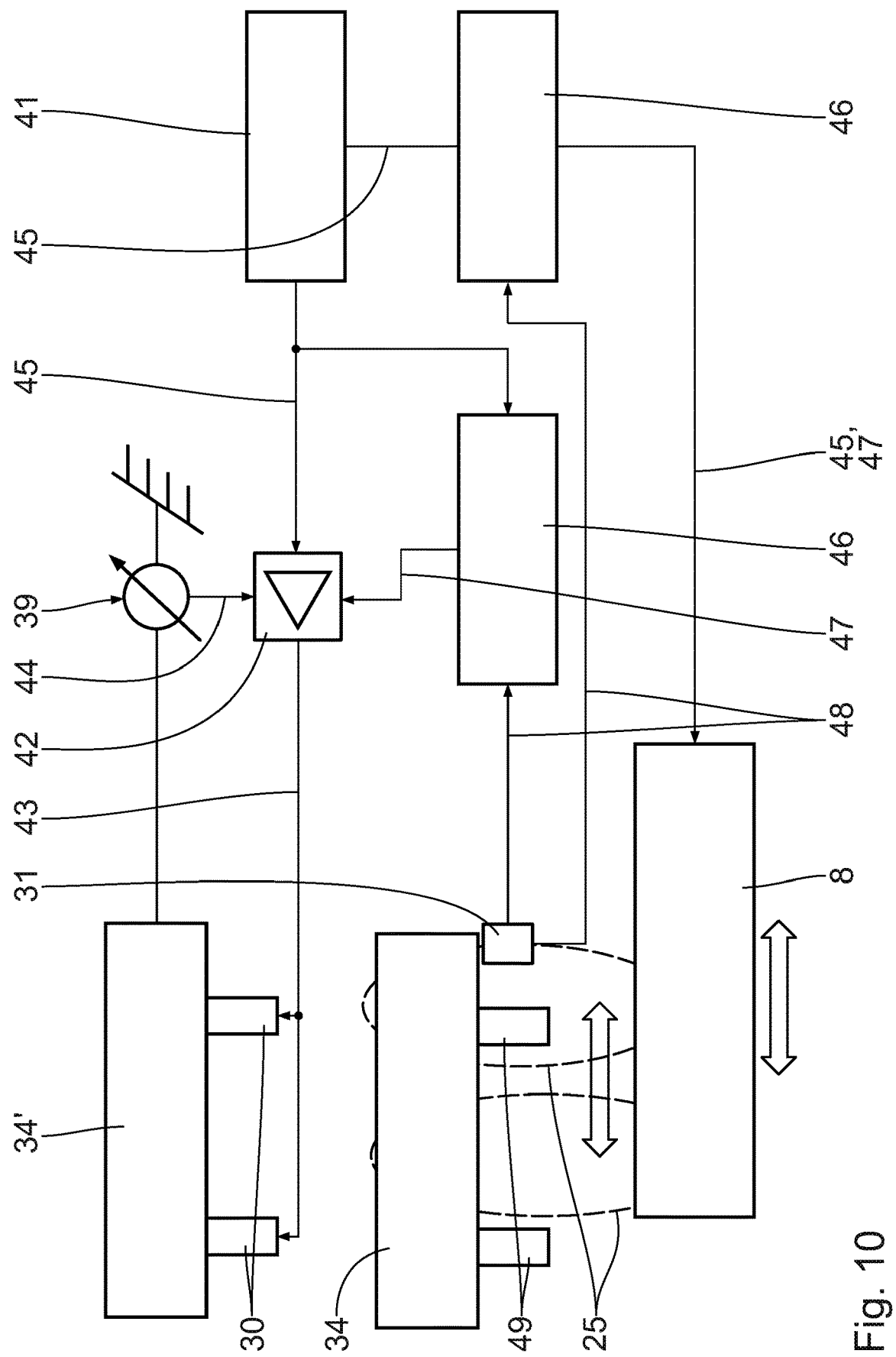
FIG. 10 shows an alternative illustration of the system according to FIG. 6.

The alternative illustrated in FIG. 10 substantially corresponds to the one illustrated in FIG. 9, wherein the input signal 48 ascertained via the sensor element 31 serves to ascertain a correction signal for correcting a regulating signal 43 for an optical component part 34', which differs from the component part 34, in whose region the sensor element 31 is arranged.

The component part 34, in whose region the sensor element 31 is arranged, can be a passive optical component part, i.e., an optical component part with a passive bearing 49, for example in the form of passive holding struts 36.

What is claimed is:

1. A method for positioning a component part of an optical system, the method comprising:
    providing an optical system, comprising:
        a plurality of component parts, of which at least one component part is displaceable via a displacement device; and
        a sensor device;
    using the sensor device to detect a stray magnetic field;
    determining, depending on the stray magnetic field detected via the sensor device, at least one correction signal for an actuating member of the displacement device to compensate an optical aberration caused by the effect of the stray magnetic field on a position of at least one of the component parts; and
    applying the correction signal to the actuating member to position the at least one displaceable component part,
    wherein determining the at least one correction signal comprises using a force feedforward control model or a position feedforward control model.

2. The method of claim 1, wherein the sensor device is in a region of a first component part, and the displacement device is in a region of second component part which is different from the first component part.

3. The method of claim 1, wherein the sensor device and the displacement device are arranged in a region of the same component part of the optical system.

4. The method of claim 1, comprising detecting the stray magnetic field in a plurality of directions and/or at a plurality of positions via the sensor device.

5. A method for positioning a component part of an optical system which comprises a plurality of component parts and a sensor device configured to detect a stray magnetic field, at least one component part being displaceable via a displacement device, the method comprising:
    using the sensor device to detect a stray magnetic field;
    determining, depending on the stray magnetic field detected via the sensor device, at least one correction signal for an actuating member of the displacement device to compensate an optical aberration caused by the effect of the stray magnetic field on a position of at least one of the component parts; and
    applying the correction signal to the actuating member to position the at least one displaceable component part,
    wherein determining the at least one correction signal comprises using a force feedforward control model or a position feedforward control model.

6. The method of claim 1, wherein the sensor device is in a region of a first component part, and the displacement device is in a region of second component part which is different from the first component part.

7. The method of claim 6, wherein the sensor device and the displacement device are arranged in a region of the same component part of the optical system.

8. The method of claim 6, comprising detecting the stray magnetic field in a plurality of directions and/or at a plurality of positions via the sensor device.

9. An optical system, comprising:
    a plurality of component parts; and
    a forward control device comprising a first sensor device, the first sensor device configured to detect a stray magnetic field,
    wherein:
        at least one component part is displaceable in a controlled fashion; and
        the forward control device is configured to control a position of the at least one of the component part based on the detected stray magnetic field.

10. The optical system of claim 9, wherein the first sensor device comprises a plurality of sensor elements configured to detect a spatial distribution of the stray magnetic field.

11. The optical system of claim 9, wherein the first sensor device is at most 100 mm from a component part that is influenceable by the stray magnetic field.

12. The optical system of claim 9, further comprising a displacement device comprising an actuating member configured to change the position of the at least one component based on the detected stray magnetic field, wherein the actuating member has a control bandwidth of at least 10 Hz.

13. The optical system of claim 9, further comprising:
    a regulating device signal-connected to the first sensor device to detect the stray magnetic field; and
    a second sensor device, the second sensor device configured to detect a position of one of the component parts.

14. The optical system of claim 9, wherein the first sensor device comprises a plurality of sensor elements configured to detect a spatial distribution of the stray field, and the first sensor device is at most 100 mm from a component part that is influenceable by the stray field.

15. The optical system of claim 14, further comprising a displacement device comprising an actuating member configured to change the position of the at least one component based on the detected stray magnetic field, wherein the actuating member has a control bandwidth of at least 10 Hz.

16. The optical system of claim 9, further comprising a displacement device comprising an actuating member configured to change the position of the at least one component based on the detected stray magnetic field, wherein:
    the actuating member has a control bandwidth of at least 10 Hz; and
    the first sensor device comprises a plurality of sensor elements configured to detect a spatial distribution of the stray field.

17. The optical system of claim 9, further comprising:
    a regulating device signal-connected to the first sensor device to detect the stray magnetic field; and
    a second sensor device, the second sensor device configured to detect a position of one of the component parts,
    wherein the first sensor device comprises a plurality of sensor elements configured to detect a spatial distribution of the stray field.

18. An apparatus, comprising:
    an illumination optical unit; and
    a projection optical unit,
    wherein:
        the apparatus comprises an optical system according to claim 9; and
        the apparatus is a projection exposure apparatus.

19. The apparatus of claim 18, wherein the illumination optical unit comprises the optical system.

20. The apparatus of claim 18, wherein the projection optical unit comprises the optical system.

* * * * *

UNITED STATES PATENT AND TRADEMARK OFFICE
CERTIFICATE OF CORRECTION

PATENT NO. : 11,169,359 B2  
APPLICATION NO. : 16/447553  
DATED : November 9, 2021  
INVENTOR(S) : Marsollek et al.

Page 1 of 1

It is certified that error appears in the above-identified patent and that said Letters Patent is hereby corrected as shown below:

In the Claims

Column 13, Line 56, Claim 6, delete "1," and insert -- 5, --;

Column 13, Line 60, Claim 7, delete "6," and insert -- 5, --;

Column 13, Line 63, Claim 8, delete "6," and insert -- 5, --.

Signed and Sealed this  
Twenty-second Day of February, 2022

Drew Hirshfeld  
*Performing the Functions and Duties of the*  
*Under Secretary of Commerce for Intellectual Property and*  
*Director of the United States Patent and Trademark Office*